United States Patent [19]

McClure

[11] Patent Number: 5,719,445
[45] Date of Patent: Feb. 17, 1998

[54] INPUT DELAY CONTROL

[75] Inventor: David C. McClure, Carrollton, Tex.

[73] Assignee: SGS-Thomson Microelectronics, Inc., Carrollton, Tex.

[21] Appl. No.: 780,053

[22] Filed: Dec. 23, 1996

[51] Int. Cl.$^6$ .................................................. H01L 23/34
[52] U.S. Cl. ...................... 257/723; 257/724; 257/786; 257/773
[58] Field of Search ........................... 257/723, 724, 257/536, 533, 379, 380, 203, 208, 786, 773; 437/205, 208; 370/503; 395/551

[56] References Cited

U.S. PATENT DOCUMENTS

| | | | |
|---|---|---|---|
| 4,128,201 | 12/1978 | Barron et al. | 235/304 |
| 4,868,425 | 9/1989 | Lindenfelser | 307/475 |
| 5,305,320 | 4/1994 | Andrews et al. | 370/503 |
| 5,345,449 | 9/1994 | Buckingham et al. | 370/100.1 |
| 5,381,416 | 1/1995 | Vartti | 371/1 |
| 5,416,918 | 5/1995 | Gleason et al. | 395/550 |
| 5,463,252 | 10/1995 | Jones et al. | 257/723 |
| 5,473,195 | 12/1995 | Koike | 257/203 |
| 5,523,620 | 6/1996 | Eytcheson et al. | 257/723 |

*Primary Examiner*—Mahshid D. Saadat
*Assistant Examiner*—S. V. Clark
*Attorney, Agent, or Firm*—Richard A. Bachand; Theodore E. Galanthay; Lisa K. Jorgenson

[57] ABSTRACT

Signal propagation times in circuit paths are matched to compensate for signal delays due to differences in the physical parameters, such as lengths, of the circuit paths. This is accomplished by adjusting the length of lead lines and by the addition of resistors in series with shorter lead lines in a chip or die. In a chip with an active device, such as logic, having multiple input lines, the lines are divided into long lines and short lines. All long lines are laid out so as to have the same length and to use the least amount of chip surface area. Similarly, all short lines are laid out on the chip so as to have the same length while using the least amount of chip surface area. With all the short lines having the same propagation time difference relative to all the long lines, the same resistive element is added to all the short lines to effect the same RC delay in signal propagation on the short lines so as to match the signal propagation time on the short lines with that on the long lines.

16 Claims, 2 Drawing Sheets

INPUT DELAY CONTROL

BACKGROUND OF THE INVENTION

1. Field of the Invention

The present invention relates to Integrated Circuits (IC) and more particularly relates to a method and apparatus for matching signal propagation time for two or more circuit paths to an active device on the IC to prevent timing skew between the signals at the input of the active device due to differing circuit path parameters.

2. Description of Related Art

With integrated circuit chips or die, bonding pads are typically located at or along their periphery to maximize the number of connections which may be made to the die. In a large IC or die, the pads for the input to a particular device may be bonded along widely separated pads along opposite edges of the periphery. Connections often must be made from relatively widely separated pin or pad like inputs located along both the lower and upper peripheral portions of the chip, to active device inputs, e.g. logic, including address decoders, word line drivers, decoder controls, buffers and the like located on the chip. Typically, the chip or die is connected to a frame or substrate with pins along the periphery of the substrate, and conductive leads are connected by bonding intermediate the pins and pads. Thus different parameter, e.g. length and/or width conductive lines from the pads and pins to the inputs of active devices are necessary due to the physical placement of the pads, pins or active devices. Many times it is necessary to add pad buffers adjacent the pads, but this kind of arrangement normally adds to signal skew at the active device(s).

One solution to the forgoing problem is to add a bond pad interior of the die, close to the circuitry. However, this requires complex packaging technology which is expensive to use. Also, the pad takes up additional space which lowers the packing density of the circuitry.

Another solution would be to place the bond pads adjacent the periphery (as they are now) and place the input circuitry at one end of the die. The problem is that some of the signal input bond pads are close to the input active circuitry while other of the signal input bond pads are far from the active input circuitry and this increases the skew. In many instances, the logic circuitry is placed in the central portion of the chip but there are always differences in conductive lead or line length, even if conductive line width is the same, which raises a signal skew problem especially in active input circuits which require very tight tolerances on skew or tight setup and hold times relative to a clocked signal input. Setup time is the time that an address is waiting to be clocked in to, for example, an input register with clock control. A typical setup time might be 2.5 ns. Hold time is the wait time after a rising signal edge to be sure an address is clocked in properly. A typical hold time is 0.5 ns. Tolerances on setup and hold times is about 0.1 to 0.2 ns (nano seconds) in high speed processors and/or memory.

The problem also presents itself in the chip in the conductive leads intermediate such devices as the outputs of an input buffer to the input of a receiver (latches) or under circumstances where there is low allowable tolerance as to signal skew in the output signal.

There have been numerous attempts at correction of signal skew, especially by the use of sophisticated delay techniques, clock accelerator techniques and the like. For example, in U.S. Pat. No. 5,345,449, issued on Sep. 6, 1994, the problem of synchronizing incoming data at a low rate with an integrated circuit processing device utilizing that data at a higher rate is addressed. In this patent, a clock generation circuit is employed in which a plurality of sequentially connected delay devices, the first of which receives a first clock signal, with each subsequent or serial delay device, is operable to produce a trigger signal in addition to an output signal after a predetermined time interval of receipt of the previous trigger signal from the previous delay device. The second clock signal is then generated by the outputs of the delay devices. This scheme is a complex one for correction of skew and it does not prevent skew.

In U.S. Pat. No. 5,381,416, issued on Jan. 10, 1995, a skew fault detection scheme is taught for detecting skew between two clock phases. The scheme employs skew fault detection circuits each of which utilizes a pair of D-type flip-flops. Once again, this patent teaches detection and notification of a skew fault. It does not inhibit the occurrence of skew fault on the device or chip itself.

In U.S. Pat. No. 5,416,918, issued on May 16, 1995 a low skew interface system for permitting receivers on an ASIC to latch information from one or more buses. A delay element is employed for delaying a clock signal so that a latch clock signal may be generated for transferring information from one buss to the chip. This patent does not teach the inhibition of the occurrence of skew fault due to different signal line parameters such as conductive line lengths or widths on the device or chip itself.

In U.S. Pat. No. 4,868,425 issued on Sep. 19, 1989 there is presented a skew compensated RS422 buffer. The compensation is for the asymmetric switching characteristics of the conventional RS422 buffer output driver stage. The means by which skew compensation is accomplished is by utilizing NOR gate means, AND gate means and first and second delay gates. (The means is discussed in Col. 1, lines 63 et seq., to col. 2, line 16). Once again the key word is compensation, not prevention of skew fault due to different signal line parameters such as conductive line lengths or widths.

In U.S. Pat. No. 4,128,201 issued on Dec. 5, 1978, synchronizing means is described for level changes in an input signal. A bistable oscillator is enabled periodically by a reference signal to respond to an input signal and assume one of two stable states. Once again, the problem of signal skew prevention on the chip or in the package itself is not discussed or solved by this patent.

SUMMARY OF THE INVENTION

In view of the above, it is a principal object of the present invention to inhibit or prevent signal skew due to differences in conductive line parameters such as lengths and/or widths between two or more die or chip input pads and active input devices which must receive carefully timed (e.g. simultaneous) input signals from the separate pads.

Another object of the present invention is to inhibit or prevent signal skew due to differences in conductive line parameters such as their lengths, to two or more active devices which must receive a signal substantially simultaneously from one pad at the same time.

Still another object of the present invention is to inhibit or prevent excessive tolerances or delays in signal setup and hold times because of normal differences in conductive line lengths to or from pads or active devices.

These and other objects are met by matching signal propagation times in circuit paths to compensate for signal delays due to differences in the physical parameters, such as lengths, of the circuit paths, i.e. the conductive lines or leads between the input pads and the input of the active device(s) or between active devices. This is accomplished by adjusting the length of lead lines and by the addition of resistors in series with shorter input lead lines in a chip or die. In a chip with an active device, such as logic, having multiple input lines, the lines are divided into the long lines and the short lines. All long lines are laid out so as to have the same length and to use the least amount of chip surface area. Similarly, all short lines are laid out on the chip so as to have the same length while using the least amount of chip surface area. With all the short lines having the same propagation time difference to all the long lines, the same resistive element is added to all the short lines to effect the same RC propagation delay in signal propagation on the short lines so as to match the signal propagation time on the short lines with that on the long lines. The active devices include, but are not limited to logic and the like etc. where predetermined or applied signal input (e.g. matched signal input) is essential to enable correct circuit operation.

Other objects and a more complete understanding of the invention may be had by referring to the following description taken in conjunction with the accompanying drawings in which:

BRIEF DESCRIPTION OF THE DRAWING(S)

FIG. 1 is a perspective view of an example IC package with an integrated circuit MOS device thereon including a circuit design to prevent signal skew, excessive tolerances or delays in signal setup and hold times because of normal differences in conductive line parameters such as length to or from the pads or active devices;

FIG. 2A is an enlarged, fragmentary plan view of a small portion of the chip or die illustrated in FIG. 1 and depicting the situation where at least two pads having differing conductive lead lengths to active circuits include signal propagation delay elements on the shorter of the lines to insure that signals applied to the input pads arrive at the active device at a predetermined and planned time;

FIG. 2B is an enlarged, fragmentary plan view of a small portion of the chip or die illustrated in FIG. 1 and illustrating the situation where at least one pad having differing conductive lead lengths to an input on separate active circuits, includes signal propagation delay means on the shorter of the lines to insure that signal application to the active circuit inputs arrive at the active devices at a predetermined and planned time;

DESCRIPTION OF THE ILLUSTRATIVE EMBODIMENT

Figure 1:
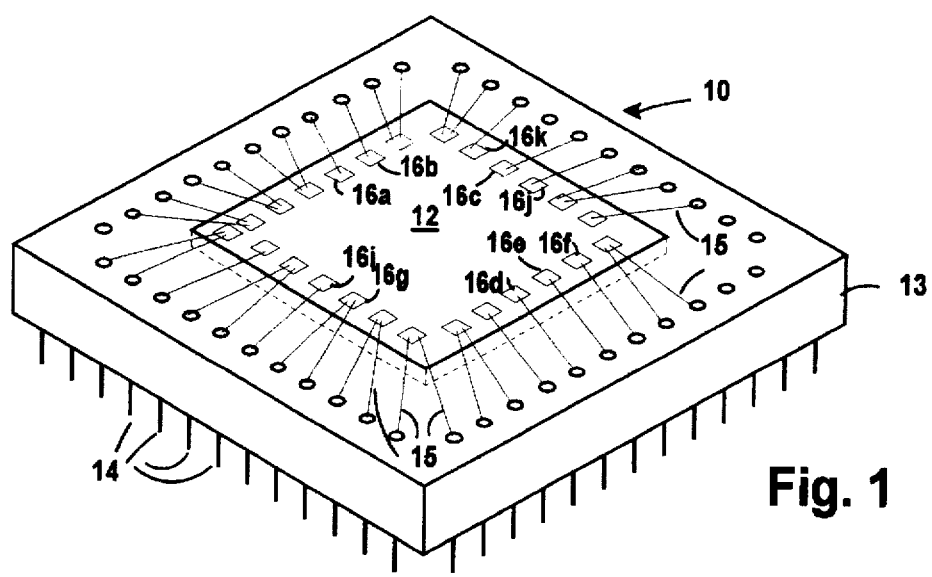

Turning now to the drawings, and specifically FIG. 1 thereof, an exemplary integrated circuit (IC) package 10 is illustrated as including an integrated circuit MOS device 12 thereon. The package 10 includes an insulating platform 13 from which pins 14 depend from the lower surface thereof. The pins 14 pass through the platform 13 and connect to leads 15, which connect in turn to input/output pads 16 located along the periphery of the MOS IC chip 12. In this connection, the present invention is not meant to exclude other types of integrated circuit packaging and the invention is not constrained by normal limitations which may be imposed by the packaging of the integrated circuit 12.

Figure 2A:
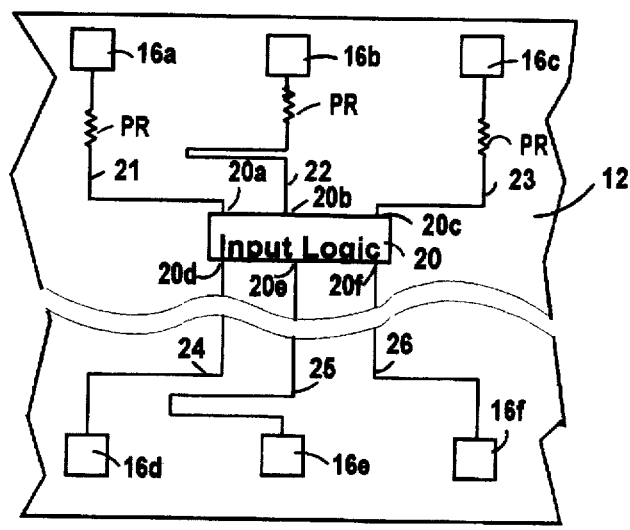
Figure 2B:
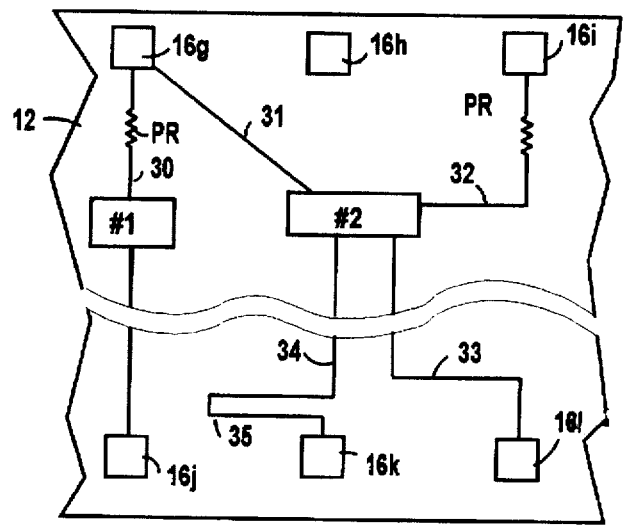

Referring now to FIGS. 2A and 2B, an enlarged, fragmentary portion of the chip or die 12 is illustrated therein with input/output (I/O) pads 16a–16f shown in FIG. 2A and I/O pads 16g–16l shown in FIG. 2B.

FIGS. 2A and 2B portray respectively, in accordance with the invention, signal path correction so that signals, propagated from the pads to the inputs of active device or devices, occur without unintended skew (e.g. substantially simultaneously) at the device inputs. Moreover by correcting for differences in conductive line lengths to or from pads or active devices, excessive tolerances or delays in signal setup and hold times are inhibited.

Depicted in FIGS. 2A and 2B are at least one of the following two conditions:

(1) at least one active device on the chip 12, requires simultaneous timed signal inputs from at least two or more input pads; and/or (2) at least two active devices on the chip 12 require simultaneous signal inputs from at least one input pad, and, common to both (1) and (2);

differing conductive line parameters, e.g. lengths and/or widths exist intermediate the pad(s) and the inputs of the active device(s).

In FIG. 2A, the input pads 16a–16c are closely adjacent input logic 20 having respective inputs 20a, 20b and 20c. Input logic 20 also has inputs 20d–20f associated with pads 16d–16f respectively. The conductive leads, links or lines 21, 22, 23 connect the input pads 16a–16c to the input logic 20 inputs 20a–20c while the conductive leads, links or lines 24, 25, and 26 connect the pads 16d–16f respectively to the input logic 20 inputs 20d—20f.

By way of example, assume that an input signals at pads 16c and 16f in FIG. 2 must arrive at the inputs 20c and 20f substantially simultaneously or within the timing tolerance of the circuit devices in input logic 20. Likewise input signals at pads 16b and 16e must arrive within a timing tolerance at the inputs 20b and 20e, and input signals at pads 16a and 16d must arrive within a timing tolerance at the inputs 20a and 20d. However, while there could be a requirement that all six inputs have simultaneity with each other, such is not the example requirement.

Substantially simultaneous as discussed in the environment of preferred embodiments of the invention described herein is a timing tolerance of 0.1 to 0.2 nanoseconds. The actual timing tolerance depends upon on the timing tolerance of the circuit devices receiving the signals.

Note that conductive lines 21 and 24 are of different lengths, and so are conductive line input pairs 22 and 25, and 23 and 26. Note also that the lines 21,22, and 23 are shorter in length than their counterparts 24, 25 and 26 respectively. Further and in accordance with a preferred embodiment of the invention, all of the short lines 21, 22 and 23 are laid out on the chip to have the same length within a predetermined tolerance. Since line 22 has the shorter direct distance to the input logic 20, line 22 is made serpentine so as to have the same length as lines 21 and 23. Similarly, all of the long lines are laid out on the chip to have the same length within a predetermined tolerance. Long line 25 is made serpentine so as to have the same length as lines 24 and 26. Now all of the short lines have a common difference in length relative to the long lines.

Delay is added to the short lines to insure that differences in the lengths of signal propagation paths, i.e. the conductive lines or leads from the input pads to the input of the logic device(s) does not create unintended skew of the input signals at the logic device. The delay is added by adding poly-silicon resistors, PR, in each of the short lines 21, 22 and 23. The resistance of the delay adjustment resistors PR in combination with capacitance in the lines adds the desired RC delay to achieve the same signal propagation time in the short lines and long lines. The value of resistance added in a short line depends upon the difference in length between a short line and long line. The value of resistance used in the resistors PR is the same for all resistors since the long lines all have the same length and the short lines all have the same length. The propagation delay difference between the lines may be due to tolerances on the lengths or the lines and tolerance on the resistance value. In any case the propagation delay difference between lines must be within the timing tolerance of the circuit device, in this case input logic 20.

In the example given in FIG. 2A, the delay adjustment resistors PR, insure that signals applied simultaneously to the input pads 16a, 16d; simultaneously to the input pads 16b, 16e, and simultaneously to the input pads 16c, 16f arrive at the respective inputs 20a–20f of the logic device (input logic 20) at a predetermined and planned time, i.e. in the example simultaneously. In other words, the conductive lines between the pads and logic input 20 in FIG. 2A are modified to add no skew to the input signals due to their length or width differences. In this connection, and as will be shown hereinafter, any actual difference in time in the application of signals at the input pad pairs will be reflected at the inputs to the logic 20 without the addition of unintended signal skew due to signal propagation time on the conductive lines.

In FIG. 2B, the condition "(2)" above is portrayed. In this portion of the chip 12, an input signal at pad 16g is assumed to be required to be applied simultaneously at the inputs to both circuit devices #1 and #2. In this connection, note that conductive lines 30 and 31 are of different lengths. This means that the shorter line 30 must include a delay adjusting resistor PR of sufficient value to effect a delay in signal propagation time along the conductive line to compensate for the added length of line 31.

Figure 3A:
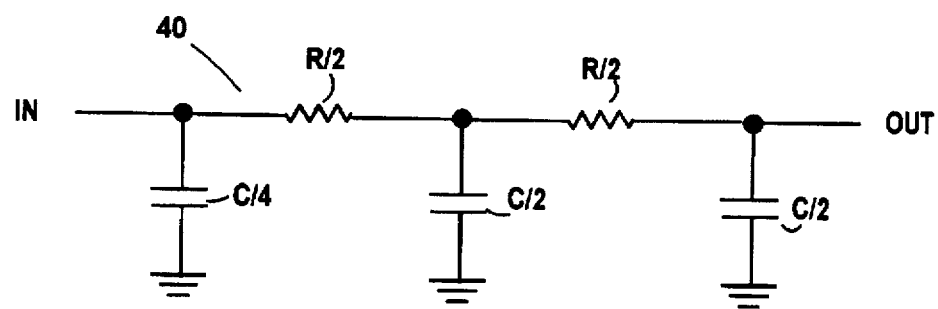
FIG. 3A is a resistance-pi (r-p) network representative of a bus or conductive line and used as a model for conductive leads or lines in the chip for use in calculating the resistance necessary to make the lines equal with regard to signal propagation.
Figure 3B:
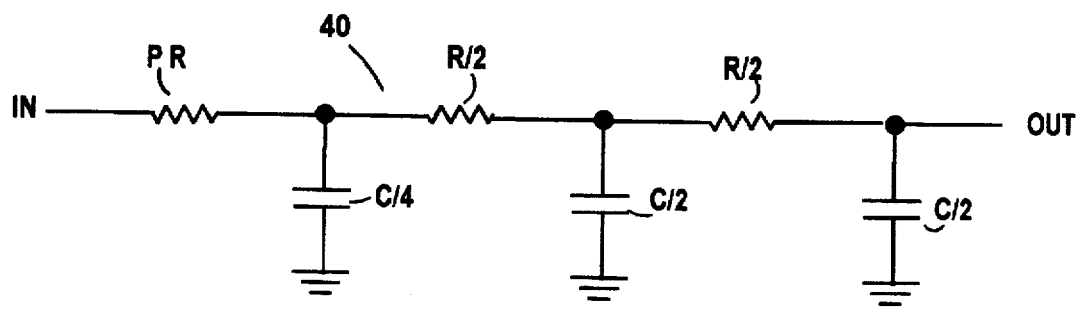
FIG. 3B is similar to FIG. 3A except a resistance 'poly-R' (PR), is added to the shorter conductive line or lines to create a delay in signal propagation along the line sufficient to make the signals, applied to both the longer and shorter lines, arrive substantially simultaneously at the input of the active device(s).

At the outset, it should be recognized that the conductive metal links, leads or lines on the chip or die 12 are composed of a mixture of aluminum/silicon-/copper or tungsten. (This list is not all inclusive.) The properties of the lines are such that they are considered to be a resistance-pi (r-p) network of resistors and capacitors such as the r-p network 40 illustrated in FIG. 3A.

In order to determine the value of the resistive element, poly-silicon resistor PR, to be placed in the shorter conductive line in each of the example situations discussed above, to insure a substantial match of signal propagation between the input pads and the inputs of the active device, a simple calculation is helpful as an approximation of the resistor PR value.

In the following example, it is assumed that it is desired to match a 7000 micron length line, 0.7 microns wide, to a 2500 micron line that is 0.7 microns wide. To this end, the process of adjusting the lead lines to have the same propagation time will be set forth in steps:

(a) Determine the length of the long conductive lead, in the example 7000 microns.

(b) Determine the length of the short conductive lead, in the example 2500 microns.

(c) Determine the difference between the long and short lead, in the example 7000−2500=4500 microns (length difference).

(d) Calculate the difference in number of squares of resistance. (With very small diameter lines, e.g. below one micron, resistance will be increased approximately with the inverse of the width.) The calculation of the number of squares of resistance may be approximated as: 4500 microns×1/0.7 microns=6429 squares of resistance.

(e) The ohmic resistance per square of the composition of the material, (in our example it is 0.03 ohms/square), times the number of squares gives the ohmic resistance to be added; i.e. R=6429×0.03=193.

(f) The ohmic resistance of polysilicon is 10 ohms/square. Therefore 193/10=19.3 squares. Dividing 19.3 squares by 0.5 microns (width of the poly-silicon resistance) yields 38.6 microns, the length of poly-silicon resistance that must be added to the short lead to make the signal propagation time on the short line substantially the same as the signal propagation time on the long lead.

If a plurality of short lead lines are being matched to a plurality of long lead lines, there are two additional steps to be performed before determine the length of the short lead and the length of the long lead:

(i) Layout the short leads on the chip so that all short leads have the same length.

(ii) Layout the long leads on the chip so that all long leads have the same length.

Now the poly-silicon resistors having the same resistance may be added to all the short lead lines.

It should be recognized that the above solution is an approximation. The reason is that capacitance in the network 40 varies in accordance with conductive line placement; other passive and active circuits adjacent to and/or connected along the path etc. Thus the final adjustment, if extreme accuracy is necessary, is made by iteratively testing the signal propagation time of the lines with different resistance values using a computer simulation until the value of resistance to be added to the short lines is finalized.

It should also be recognized that multiple calculations, such as the forgoing, may have to be conducted. For example, and referring now to FIG. 2B, the input from pad 16i, e.g. line 32 may have to be matched with an input along line 33 from pad 16l. This of course would require a different calculation because the longer and shorter lines, 33 and 32 respectively, are initially different lengths than the example given above. Thus, the resistor PR in shorter line 32 is a different value than that calculated above.

In the event that active device #2 has a third signal input from conductive line 34 and input pad 16k, conductive line 34 (if it is determined to be shorter than line 33) may also be provided with a delay adjusting resistor PR, depending once again upon its calculation. Moreover, if line 34 is the same width as line 33, and there is sufficient area on the chip, then making conductive line 34 a serpentine such as at 35 will allow line 34 to approximate the length of line 33 making a PR resistive adjustment unnecessary.

In the same or similar manner as described above, the input signals to the input logic 20 or active devices #1 and #2, if critical, may be calculated taking into account the length, composition etc. of the bonded wire 15 between the pins 14 and the pads 16 of the chip 12.

In a like manner to the above, it should be recognized that the procedure set forth above is equally applicable if it is essential that signals arriving at two or more output pads, or between two or more devices on the chip 12 be in synchronism. That is the same technique for insuring that no signal skew is added by having differing conductive line parameters at the pad input to the chip also applies to the output.

Thus, one of the principal objects of the present invention, to prevent signal skew due to differences in conductive line parameters (e.g. lengths/widths) between two or more die or chip input pads and circuit devices or between two or more circuit devices which circuit must receive carefully timed (e.g. simultaneous) input signals is achieved. In a like manner, the present invention prevents signal skew due to differences in conductive line parameters, e.g. lengths, to two or more circuit devices which must receive a signal from one pad or one other circuit device. In a like manner, the present invention prevents excessive tolerances or delays in signal setup and hold times because of normal differences in conductive line lengths to or from the pads and circuit devices.

Although the invention has been described with a certain degree of particularity, it should be recognized that elements thereof may be altered by person(s) skilled in the art without departing from the spirit and scope of the invention as hereinafter set forth in the following claims.

I claim:

1. An integrated circuit chip having a plurality of input/output pads thereon, and at least one circuit device thereon requiring signal inputs from at least two or more input pads within a predetermined timing tolerance, and conductive leads or lines intermediate said pads and the inputs to said circuit device, said conductive lines having different physical parameters, comprising:
    a delay adjusting element to insure that signal application to said input pads arrive at said inputs of said circuit device at a predetermined and planned time;
    said delay adjusting element being added in one of said two conductive lines to insure a substantial match of signal propagation between said input pads and the inputs of said circuit device.

2. An integrated circuit chip in accordance with claim 1, wherein said different physical parameter is length; and wherein said delay adjusting element is a resistive element connected in series in the shorter of said two conductive lines to add RC delay to the shorter of said two conductive lines.

3. An integrated circuit chip in accordance with claim 1, wherein said different physical parameter is conductive line resistance; and wherein said resistive element is connected in series in the conductive line that is of the least resistance of said two conductive lines.

4. An integrated circuit chip having a plurality of input/output pads thereon adjacent the periphery thereof, and at least two circuit devices thereon requiring substantially simultaneous signal inputs from at least one input pad, and conductive lines intermediate said pad and the inputs to said circuit devices, said conductive lines being of different physical parameters, comprising:
    a delay adjusting element to insure that simultaneous signal application to said input pads arrives at the inputs of said circuit devices at a predetermined and planned time;
    said delay adjusting element being added in one of said two lines to insure a substantial match of signal propagation along said lines between said input pad and the inputs of said circuit devices.

5. An integrated circuit chip in accordance with claim 4, wherein said different physical parameter is length; and wherein said resistive element is connected in series in the shorter of said two conductive lines.

6. An integrated circuit chip in accordance with claim 4, wherein said different physical parameter is conductive line resistance; and wherein said resistive element is connected in series in the conductive line that is of the least resistance of said two conductive lines.

7. An integrated circuit chip having a plurality of input/output pads thereon adjacent the periphery thereof, comprising:
    one of the following:
        (1) at least two circuit devices thereon requiring simultaneous signal inputs from at least one input pad, or
        (2) at least one circuit device thereon requiring simultaneous signal inputs from at least two or more input pads;
    and conductive lines between said pad(s) and the inputs of said circuit device(s), said conductive lines having differing lengths;
    a length added to the shorter of said conductive lines that signals applied to said input pad(s) arrive at the inputs of said active device(s) at a predetermined and planned time;
    added in series in one of said conductive lines, a resistive element having a resistance establishing a substantial match of signal propagation time between said input pads and the inputs of said circuit device.

8. An integrated circuit chip in accordance with claim 7, wherein said conductive lines differ in conductive line resistance; and wherein said resistive element is connected in series in the conductive line that is of the least resistance of said two conductive lines.

9. The integrated circuit chip of claim 7 wherein the resistance of the resistive element is the amount of resistance, depending upon the constituents of the conductive lines, that must be added to the shorter of the two lines to make the resistance of the lines approximately equal whereby signals propagating along the lines arrive at the ends of the lines approximately simultaneously.

10. In an integrated circuit chip having a circuit device and a plurality of lead lines connected to the circuit device, apparatus for providing within a predetermined timing tolerance a signal propagation time over all of the lead lines to the circuit device, said apparatus comprising:
    all of the lead lines being laid out on the chip so as to have one of two possible lengths so as to provide short lines and long lines;
    a resistive element added to each of the short lines to provide an RC delay in signal propagation time to signals on the short lines;
    said resistive elements on all short lines having the same resistance value and said resistance value providing an RC delay in the short lines to match signal propagation time in the short lines to signal propagation time in the long lines within the predetermined timing tolerance.

11. The apparatus of claim 10 wherein said short lines are laid out in serpentine paths as necessary to make all short lines the same length while minimizing the surface area of the chip used by the short lines.

12. The apparatus of claim 11 wherein said long lines are laid out in serpentine paths as necessary to make all long lines the same length while minimizing the surface area of the chip used by the long lines.

13. The apparatus of claim 12 wherein the resistance value of said resistive elements depends upon the difference in length between the long lines and the short lines.

14. In an integrated circuit chip having a circuit device and a plurality of lead lines connected to the circuit device, a method for providing a signal propagation time over all of the lead lines to the circuit device, the signal propagation time varying within a timing tolerance dependent upon timing requirements of the circuit device, said method comprising the steps of:

laying out the lead lines to the circuit device as one or more short lead lines and one or more long lead lines, all of said short lead lines having the same length within a predetermined tolerance and all of said long lead lines have the same length within a predetermined tolerance;

adding signal propagation delay to all of the short lines, said signal propagation delay being the same for all short lines within a predetermined tolerance, the predetermined tolerances on lengths of short lines and long lines and the predetermined tolerance on the propagation delay providing for a signal propagation time for all lead lines varying within the timing tolerance of within the timing requirements of the circuit device.

15. The method of claim 14 wherein said adding step adds a resistive element to each short line, the resistive element's resistance along with the capacitance of the short line providing the signal propagation delay.

16. The method of claim 15 wherein said resistive element is a poly-silicon resistance material and an amount of poly-silicon resistance material to be added to each short line is determined by the following steps:

determine the length of the long lines;

determine the length of the short lines;

determine the difference in length between the long lines and the short lines;

calculate the difference in number of squares of resistance between the long lines and short lines;

calculate the resistance to be added to the short lines from the difference in number of squares of resistance and the resistance per square of the lines;

calculate from the resistance to be added an amount of poly-silicon resistance material to be added to the short lines.

* * * * *